United States Patent [19]

Meunier

[11] Patent Number: 4,914,533
[45] Date of Patent: Apr. 3, 1990

[54] DIFFERENTIAL AMPLIFIER WITH DIFFERENTIAL OUTPUTS

[75] Inventor: Thierry Meunier, Obereschach, France

[73] Assignee: SGS-Thomson Microelectronics S.A., Gentilly, France

[21] Appl. No.: 208,225

[22] Filed: Jun. 17, 1988

[30] Foreign Application Priority Data

Jun. 19, 1987 [FR] France .................. 87 08656

[51] Int. Cl.⁴ .................................. G11B 5/02
[52] U.S. Cl. ........................................ 360/67
[58] Field of Search .................. 360/67, 68, 64; 377/111; 370/260, 290; 307/543, 562

[56] References Cited

U.S. PATENT DOCUMENTS 4,577,336 11/1986 Kriedt et al. .................. 377/111

OTHER PUBLICATIONS

T. Schwarz, "Offset Compensation Circuit", IBM Technical Disclosure Bulletin, vol. 19, No. 3, Feb. 19, 1977): 3584, 3585.

Patent Abstracts of Japan, vol. 2, No. 130 (Oct. 28, 1978).

J. Engelbrecht, "Input Offset Compensation for Photo-diode Amplifier", IBM Technical Disclosure Bulletin, vol. 26, No. 3B (Aug. 1983): 1377, 1378.

Primary Examiner—Vincent P. Canney
Attorney, Agent, or Firm—Lowe, Price, LeBlanc, Becker & Shur

[57] ABSTRACT

The present invention relates to a differential amplifier with differential outputs comprising a reference input, a signal input, a first (2) and a second (3) low-pass filter respectively connected with a differential output and with a comparator input (4), the comparator output being connected with the reference input of the amplifier in order to form a regulation loop which compensates for the d.c. level variations of the signal applied to the signal input and which servo-controls the d.c. level difference of the outputs to a value approaching zero. The invention applies to integrated circuits with differential amplifiers.

6 Claims, 2 Drawing Sheets

DIFFERENTIAL AMPLIFIER WITH DIFFERENTIAL OUTPUTS

TECHNICAL FIELD

The invention relates to an integrable differential amplifier with differential outputs. It also relates to its application to circuits for switching the reading heads of video tape recorders.

BACKGROUND OF THE INVENTION

In certain implementations, especially in circuits for switching the reading heads of video tape recorders which require amplifiers with differential outputs, it is compulsory for obtaining good operating conditions of the downstream circuit (switch), which receives the output signals from the amplifier, that those output signals do not present any d.c. level. On the other hand, it is also compulsory that there is not a large difference between the d.c. levels or at least that this d.c. level difference be as low as possible. Those offset voltages may have various origins, and are generally not clearly determined. The usual way to solve this problem then consists in locating on the amplifier signal input a serial capacitor, this capacitor is then located between the upstream circuit and the amplifier. The purpose of the capacitor is to cancel the offset. However, not all the causes of the offset are cancelled. A d.c. level appears more particularly on each of the outputs, this level varies in a non-determined way and is amplified at the outputs.

As a matter of fact, the differential amplifier conventionally comprises two transistors biased by the d.c. component of the input signal. When a serial capacitor is used at the signal input, the d.c. component of the signal is suppressed. It is then necessary to bias the base of the transistors. To achieve this purpose, a reference source is used as well as a resistor connected between this source and the base of each of the amplifying transistors. always Because it is impossible to get resistors strictly identical in value, a offset occurs at the amplifier outputs. This offset is amplified at the output by the gain provided by the circuit.

On the other hand, in order to bias the transistors, it is necessary to use resistors with a high value which, of course, add some noise. To avoid adding more noise when using resistors with high value, resistors with lower value are used as well as capacitors with higher value. One is then faced with the problem caused by the integration of such capacitors. It is then necessary to choose between noise and integration. One generally uses a capacitor with a high value (but not integrated) connected with the housing of the integrated circuit by means of two connecting pins of the housing.

The problem to solve involves providing a differential amplifier which does not present any d.c. level variation between its outputs, which can be integrated, which does not add any noise and which further avoids the use of two housing connection pins.

BRIEF SUMMARY OF THE INVENTION

The object of the instant invention is accordingly to provide for a differential amplifier which comprises a circuit to compensate for the d.c. level variations of the signal input and to servo-control the difference in the output d.c. levels at a constant level without adding noise.

A more specific object of the invention is to provide for a differential amplifier comprising two differential inputs, one of them being a signal input and the other one being a reference input, and two differential outputs, essentially comprising a first and a second lowpass filter, the first filter being connected with one differential output, the second filter being connected with the other differential output; a comparator with two inputs and one output, respectively receiving at one input the output signal of one of the filters and at the other input the output signal of the other filter, the comparator output being connected with the reference input of the amplifier in order to form a regulation loop which compensates for the d.c. level variations at the input and which servo-controls the d.c. level difference of the outputs to a value approaching zero.

BRIEF DESCRIPTION OF THE DRAWINGS

Other features and advantages of the instant invention will clearly appear in the following detailed description of preferred embodiments, in connection with the attached drawings, wherein:

In FIG. 1, a block diagram of a differential amplifier according to the invention is shown. Amplifier 1 receives on one of its differential inputs A1, a signal T1 with a not clearly determined d.c. level. This signal T1 is emitted from an upstream circuit (not shown), the drawing of which is not necessary to understand the invention, but a preferred embodiment of which is shown in the drawing of the implementation of FIG. 3. Amplifier 1 has two differential outputs S1 and S2. Output S1 is connected with one input E1 of a low-pass filter 2 and output S2 is connected with one input E2 of a low-pass filter 3. Output F1 of filter 2 is connected with one input C1 of a comparator 4 and output F2 of filter 3 is connected with the other input C2 of same comparator 4. Output C4 of comparator 4 is connected either directly with the differential input A2 of amplifier 1 which is designed to receive a reference voltage, or indirectly by means of a low-pass filter 5. This filter 5 receives at its input E5 the output signal of comparator 4 and its output F5 is connected with input A2 and is designed to suppress the noise of comparator C4 and to improve the performances of the two integratable filters 2 and 3.

Thus, signal T1 which may have a d.c. component, is not filtered by a serial capacitor as in the prior art but is directly applied to the signal input of amplifier 1 which amplifies the signal with the d.c. component. This d.c. level is not the same on each of the outputs since it is independently modified on both outputs by the flowing of the signal in the amplifier through the resistors which cannot be strictly identical. Those d.c. levels, which may therefore be different for the reasons previously explained, that is, it is not possible to obtain resistor values strictly identical inside the comparator, are filtered by filters 2 and 3 in order to obtain at the output of filter 2 the d.c. component of output S1 and at the output of filter 3 the d.c. component of output S2.

The amplifier thus comprises a regulation loop which permits to compensate for the variations of the d.c. component of the input signal T1 and to servo-control the difference of the d.c. signals of the outputs to a value approaching zero. The regulation loop is so designed that the device has a tendency to cancel the d.c. offset existing between the differential outputs S1 and S2.

The principle involved to reduce the offset at the output then consists in measuring this offset and servo-controlling it to a value approaching zero.

The instant invention then solves the aforementioned problems, that is to cancel the d.c. offset on the differential outputs, to obtain a very low noise level, a perfect integration compatability and further to reduce the number of pins used in the integrated circuit housing comprising the amplifier.

Figure 2:
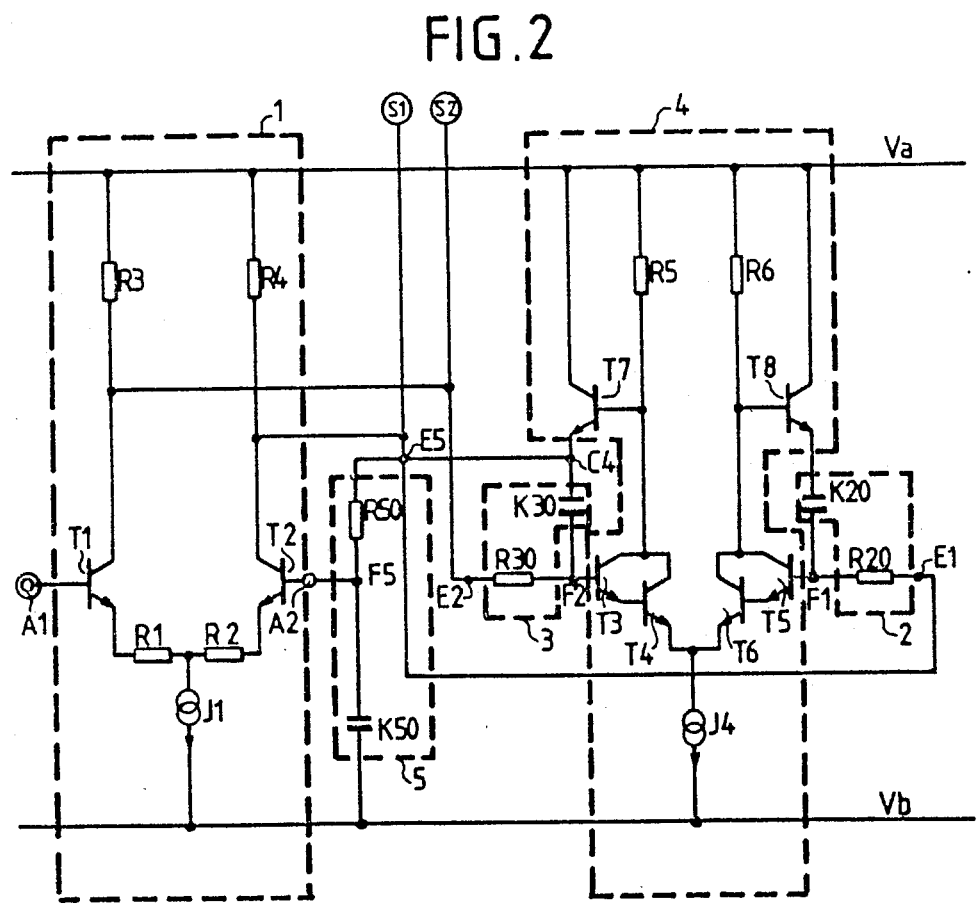
FIG. 2 shows a detailed diagram of the amplifier of FIG. 1.

FIG. 2 shows a more detailed diagram of the amplifier according to the invention. Transistors T1 and T2 have their emitters respectively connected, through resistors R1, R2, with a current source J1 which is itself connected with a supply terminal Vb. The collectors of transistors T1 and T2 are connected, through resistors, respectively R3 and R4, with the other supply terminal Va. Output S1 is, for example, the junction between the collector of transistor T2 and one terminal of resistor R4, while the output S2 is, for example, the junction between the collector of transistor T1 and one terminal of resistor R3.

Filter 2 is constituted by resistor R20 and capacitor K20. The filter 3 is constituted by resistor R30 and capacitor K30. The signal from output S2 is applied to the input E2 of filter 3. The signal from output F1 of filter 2 is applied on the base of a transistor T5 of comparator 4 and the signal from output of filter 3 is applied on the base of transistor T3 of this comparator 4.

The comparator is in fact constituted in a conventional way, by a Darlington circuit comprising the transistors T3, T4 and T5, T6. The emitters of transistors T4, T6, are connected with a current source J4 which is in turn connected with voltage Vb of the voltage supply.

One of the outputs of the Darlington circuit corresponds to the collectors of transistors T5 and T6 and the collector signal of those transistors is applied to the base of a transistor T8, the emitter of which is connected with a terminal of capacitor K20 of filter 2, and the collector of which is connected with the voltage Va of the voltage supply. Transistor T8 is biased by a resistor R6 which is connected between its base and voltage Va.

The other output of Darlington circuit corresponds to the collectors T3, T4, providing a signal which is applied onto the base of a transistor T7 biased by a resistor R5 connected between this base and voltage Va of the voltage supply, and the emitter of which corresponds to the comparator output. The signal from this output C4 is applied to the input A2 of the amplifier or preferentially, as shown, to the input E5 of the filter 5, output F5 of this filter being connected with input A2 of the amplifier.

Filter 5 comprises a resistor R50 and a capacitor K50, the resistor being connected between terminals E5 and F5, capacitor K50 being connected between the output F5 which is directly connected with the reference input A2 and the voltage Vb of the supply voltage.

By way of example, if one wishes to obtain a low cut-off frequency of 10 KHz, one uses capacitors K20 and K30 of 20 pF and resistors R20, R30 of 1 MΩ and one capacitor K50 of 220 nF and one resistor of 1 KΩ. Capacitor K50 is external to the integrated circuit but needs only one connection pin, that is the terminal corresponding to junction F5, as the other connection pin is already present in the circuit since it is the voltage Vb. This capacitor permits grounding the noises coming from the comparator device. If one takes into account that the base current of the Darlington circuit is in the range of 0.1 mA and that the inaccuracy in the value of resistors R20 and R30 reaches 5%, one obtains an output offset voltage in the range of 5% multiplied by the value of resistor R20 or R30 and multiplied by the base current, that is to say an offset voltage equal to 5 mV.

Figure 1:
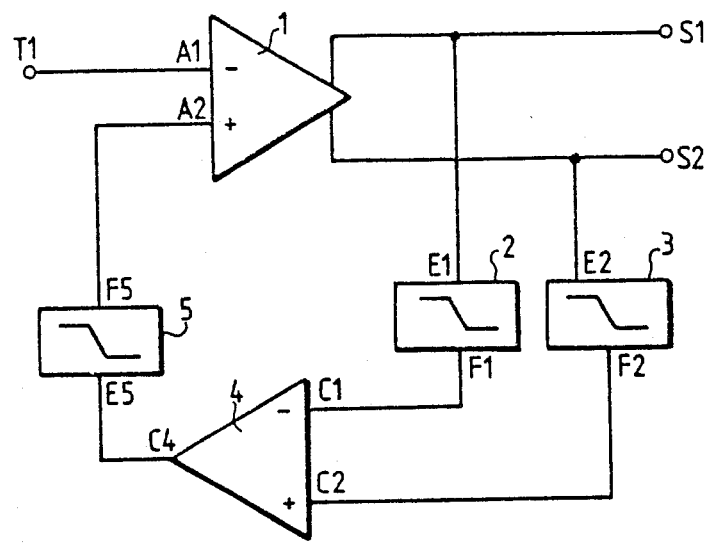
FIG. 1 shows a general diagram of an amplifier according to the invention.
Figure 3:
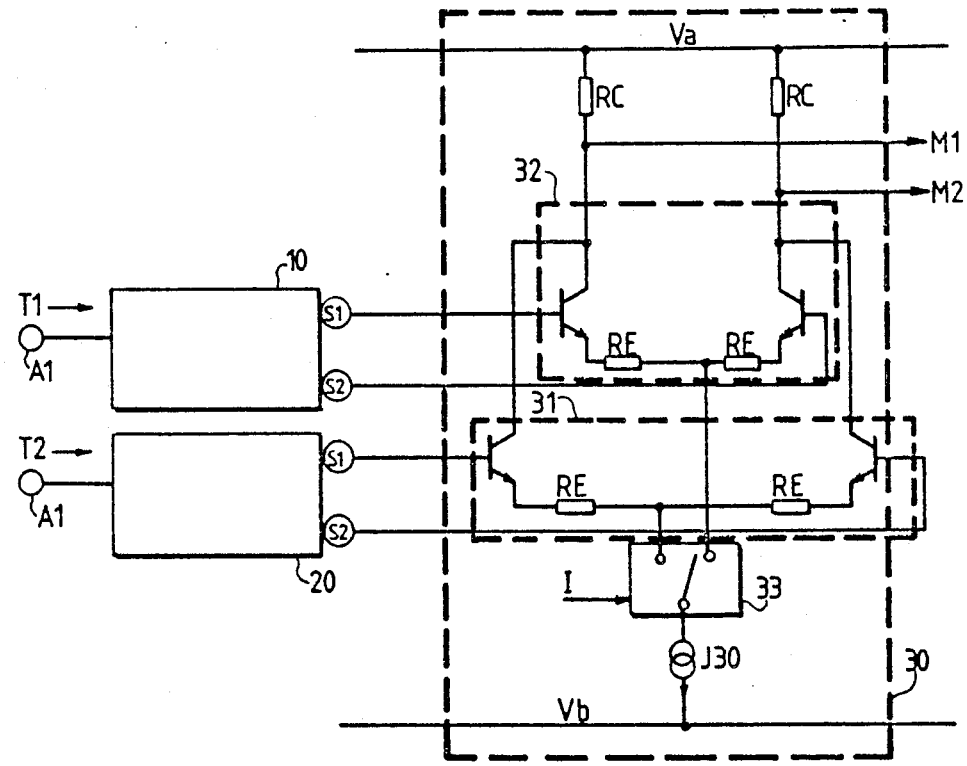
FIG. 3 shows a block diagram of a preferred embodiment of the amplifier according to this invention.

A preferred embodiment of the amplifier according to the invention is shown in FIG. 3. This implementation consists in using two amplifiers such as disclosed in connection with FIG. 1 or FIG. 2, those amplifiers being used for amplifying the signal from the reading heads of a video tape recorder. The two reading heads (not shown in this FIG.) provide signals T1 and T2 which must be switched. The two heads are diametrically opposite and read the one after the other information recorded on the tape of the video tape recorder. One switches from one head to the other according to the rotation speed of the reading head.

The outputs of each of the two amplifiers 10 and 20 are connected with the inputs of a switch 30 which permits to provide at its outputs M1, M2, either the signals emitted from outputs S1, S2 of amplifier 10, or the signals emitted from outputs S1, S2 of amplifier 20. In order that the switching carried out by this switch 30, known per se, be possible, it is necessary that no large variation appears between outputs S1, S2 of each of the amplifiers. The amplifiers according to the invention thus carry out this switching between signals T1 and T2. Switch 30 in fact comprises two differential amplifiers 31 and 32, known per se, and one switch 33 controlled by a signal I easily obtained from the clock signals of the circuit and a current source J30 which is alternately connected by signal I either with amplifier 32 or with amplifier 31 in order that alternately either the output signals from amplifier 10 or the output signals from amplifier 20 be present at outputs M1 and M2.

Moreover, the offset between outputs S1 and S2 of amplifier 10 and the offset between outputs S1 and S2 of amplifier 20 may then have the same polarity, for example +10 mV and +8 mV. The offset difference existing at the switch input is however low since it is equal to 2 mV.

I claim:

1. A differential amplifier comprising two differential inputs, one of which is a signal input having a nonfiltered signal applied directly thereto and the other one of which is a reference input, and two differential outputs, a first and a second low-pass filter, the first filter being connected with one differential output, the second filter being connected with the other differential output, a comparator having two inputs and one output respectively receiving on one input an output signal from one of the filters and on the other input an output signal from the other filter, the output of the comparator being connected with said reference input of the amplifier in order to form a regulation loop which compensates for the d.c. level variations of said signal applied directly to said signal input and which servo-controls the d.c. levels difference of the outputs to a level approaching zero.

2. An amplifier according to claim 1, comprising one low-pass filter of the RC type located between the comparator output and the reference input.

3. An amplifier according to claim 1, wherein the first and second filters comprise lowpass arrays of the RC type.

4. An amplifier according to claim 1, wherein the elements of said amplifier are integrated, and further comprising a third filter connected between the comparator output and the reference input, said third filter including a discrete capacitor being connected externally between the reference input and a supply terminal.

5. A circuit for switching reading heads of video tape recorders comprising a switch and two differential amplifiers, each of said differential amplifiers comprising two differential inputs, one of which is a signal input and the other one of which is a reference input, and two differential outputs, a first and a second low-pass filter, the first filter being connected with one differential output, the second filter being connected with the other differential output, a comparator having two inputs and one output respectively receiving on one input an output signal from one of the filters and on the other input an output signal from the other filter, the output of the comparator being connected with said reference input of the amplifier in order to form a regulation loop which compensates for d.c. level variations of a signal applied to said signal input and which servo-controls the d.c. levels difference of the outputs to a level approaching zero, the first amplifier receiving, at the signal input, a signal from a first reading head, the second amplifier receiving at the signal input, a signal from a second reading head, the differential outputs of each of the amplifiers being connected with inputs of said switch, said switch comprising two outputs corresponding to the output signals from the first amplifier and the output signals from the second amplifier.

6. A method for suppressing variable d.c. levels of an unfiltered input signal applied to a differential amplifier having two inputs and two outputs, comprising the steps of:

applying said input signal directly to a first input of said amplifier, generating a reference voltage, and applying said reference voltage to a second input of said amplifier, wherein said step of generating a reference voltage comprises filtering a first differential output of said amplifier to obtain a first low-pass signal, filtering a second differential output of said amplifier to obtain a second low-pass signal, and comparing said first low-pass signal and said second lowpass signal to derive said reference voltage.

* * * * *